(12) United States Patent
Guan et al.

(10) Patent No.: US 10,923,505 B2
(45) Date of Patent: Feb. 16, 2021

(54) METHOD FOR FABRICATING A DISPLAY SUBSTRATE BY GENERATING HEAT WITH A LIGHT SHIELDING LAYER FOR CRYSTALLIZATION OF A SEMICONDUCTOR LAYER

(71) Applicant: BOE TECHNOLOGY GROUP CO., LTD., Beijing (CN)

(72) Inventors: Feng Guan, Beijing (CN); Lu Wang, Beijing (CN); Woobong Lee, Beijing (CN); Jianhua Du, Beijing (CN); Yang Lv, Beijing (CN); Zhaohui Qiang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/535,447

(22) Filed: Aug. 8, 2019

(65) Prior Publication Data
US 2020/0119052 A1 Apr. 16, 2020

(30) Foreign Application Priority Data
Oct. 10, 2018 (CN) .......................... 2018 1 1176158

(51) Int. Cl.
*H01L 27/12* (2006.01)
(52) U.S. Cl.
CPC ...... *H01L 27/1222* (2013.01); *H01L 27/1274* (2013.01)

(58) Field of Classification Search
CPC ............. H01L 27/1218; H01L 27/1222; H01L 27/1225; H01L 27/1274; H01L 27/1277;
(Continued)

(56) References Cited

U.S. PATENT DOCUMENTS 6,558,986 B1    5/2003  Choi
9,165,948 B2 *  10/2015  Iyama ............... G02F 1/134309
(Continued)

FOREIGN PATENT DOCUMENTS

CN    102465338 A     5/2012
CN    103474430 A    12/2013
(Continued)

OTHER PUBLICATIONS

First Office Action and English language translation, CN Application No. 201811176158.9, Apr. 23, 2020, 17 pp.
(Continued)

*Primary Examiner* — Andrew Q Tran
(74) *Attorney, Agent, or Firm* — Myers Bigel, P.A.

(57) ABSTRACT

The present disclosure provides a display substrate, a fabricating method thereof, and a display device. The method includes forming a light shielding layer on a surface of a base substrate, and forming a plurality of thin film transistors on a side of the light shielding layer away from the base substrate. Forming a plurality of thin film transistors on a side of the light shielding layer away from the base substrate includes forming a semiconductor layer at a position where an active layer is to be formed in each of the plurality of thin film transistors, generating heat using the light shielding layer, and utilizing the heat to crystallize the semiconductor layer.

16 Claims, 10 Drawing Sheets

(58) Field of Classification Search
CPC ........... H01L 27/1296; H01L 29/66757; H01L 29/66969; H01L 29/78603; H01L 29/78633; H01L 29/78675; H01L 29/7869
See application file for complete search history.

(56) References Cited

U.S. PATENT DOCUMENTS

| | | |
|---|---|---|
| 2001/0003446 A1 | 6/2001 | Takafuji |
| 2004/0135236 A1* | 7/2004 | Hirano .................... H01L 27/12 257/662 |
| 2009/0042343 A1 | 2/2009 | Kakkad |
| 2016/0190171 A1 | 6/2016 | Wang et al. |
| 2016/0315103 A1 | 10/2016 | Qi et al. |
| 2017/0243896 A1 | 8/2017 | Zhang |
| 2019/0051671 A1 | 2/2019 | Ban et al. |

FOREIGN PATENT DOCUMENTS

| | | |
|---|---|---|
| CN | 104600080 A | 5/2015 |
| CN | 104851891 A | 8/2015 |
| CN | 105527771 A | 4/2016 |
| CN | 106847987 A | 6/2017 |
| CN | 107452758 A | 12/2017 |
| CN | 107779586 A | 3/2018 |
| CN | 108470717 A | 8/2018 |
| KR | 20020017782 A | 3/2002 |
| KR | 20020076631 A | 10/2002 |
| TW | 491987 B | 6/2002 |
| TW | I294649 B | 3/2008 |
| TW | 200924067 A | 6/2009 |

OTHER PUBLICATIONS

"Second Office Action and English language translation", CN Application No. 201811176158.9, dated Oct. 23, 2020, 17 pp.

* cited by examiner

METHOD FOR FABRICATING A DISPLAY SUBSTRATE BY GENERATING HEAT WITH A LIGHT SHIELDING LAYER FOR CRYSTALLIZATION OF A SEMICONDUCTOR LAYER

RELATED APPLICATION

The present application claims the benefit of Chinese Patent Application No. 201811176158.9, filed on Oct. 10, 2018, the entire disclosure of which is incorporated herein by reference.

TECHNICAL FIELD

The present disclosure relates to the display technology, in particular to a display substrate, a fabricating method thereof and a display device.

BACKGROUND

At present, an active layer of a thin film transistor in a display substrate is formed by crystallizing an amorphous semiconductor material employing excimer laser anneal (ELA) technology.

However, this technology has disadvantages of high cost, short running time, long production period, difficult process control and poor grain size uniformity. In addition, due to the length limitation of the excimer laser beam, this technique is difficult to apply to high generation lines (G≥6.5, G represents the generation, i.e. size of the base substrate in the display substrate). Therefore, the related art of the display substrate need to be improved.

SUMMARY

In one aspect of the disclosure, the present disclosure provides a method for fabricating a display substrate. According to an embodiment of the present disclosure, the method includes: forming a light shielding layer on a surface of a base substrate; and forming a plurality of thin film transistors on a side of the light shielding layer away from the base substrate, wherein forming a plurality of thin film transistors on a side of the light shielding layer away from the base substrate includes: forming a semiconductor layer at a position where an active layer is to be formed in each of the plurality of thin film transistors; generating heat using the light shielding layer, and utilizing the heat to crystallize the semiconductor layer.

According to an embodiment of the present disclosure, a material of the light shielding layer includes a conductive material, and generating heat using the light shielding layer includes energizing the light shielding layer.

According to an embodiment of the present disclosure, the light shielding layer includes a plurality of sub-light shielding layers disposed at intervals, the plurality of thin film transistors includes a plurality of thin film transistor groups, an orthographic projection of each of the plurality of sub-light shielding layers on the base substrate covers an orthographic projection of active layers in a corresponding thin film transistor group on the base substrate, each of the plurality of thin film transistor groups includes at least one the thin film transistor, and energizing the light shielding layer includes: connecting a first contact and a second contact of each of the plurality of sub-light shielding layers to a positive pole and a negative pole of a power source respectively, wherein the first contact and the second contact are located on both sides of the orthographic projection of the active layers in the corresponding one of the thin film transistor groups on the light shielding layer.

According to an embodiment of the present disclosure, a deviation between first quantities of heat per unit area of the plurality of sub-shielding layers is not more than 3%, and a first quantity of heat per unit area is a ratio of heat generated by one of the sub-shielding layers to an area of the sub-shielding layer.

According to an embodiment of the present disclosure, the step of forming the light shielding layer on the surface of the base substrate includes: adjusting an area of each of the plurality of sub-light shielding layers based on a sheet resistance distribution of the light shielding layer, such that the deviation between the first quantities of heat per unit area of the plurality of sub-shielding layers is not more than 3% when currents flow through the plurality of sub-shielding layers are the same.

According to an embodiment of the present disclosure, the step of forming the light shielding layer on the surface of the base substrate further includes: forming a conductive layer on a surface of the base substrate; detecting sheet resistance values $R_1, R_2, \ldots, R_n$ at n positions on the conductive layer, and calculating an average sheet resistance value $R_{average}$ of the conductive layer based on the detected sheet resistance values; patterning the conductive layer to form M sub-shielding layers, an area of the i-th sub-shielding layer being determined based on the formula $A_i'=(R_{average}/R_i)\times A_i$, where $A_i'$ is an actual area of the i-th sub-shielding layer, $A_i$ is a theoretical area of the i-th sub-shielding layer, $R_i$ is the sheet resistance value corresponding to the i-th sub-shielding layer, n is a positive integer, M is a positive integer greater than 1, and i is a positive integer between 1 and M.

According to an embodiment of the present disclosure, energizing the light shielding layer includes: adjusting a current flowing through each of the plurality of sub-light shielding layers based on a sheet resistance distribution of the light shielding layer, such that the deviation between the first quantities of heat per unit area of the plurality of sub-shielding layers is not more than 3%.

According to an embodiment of the present disclosure, the plurality of thin film transistors share a light shielding layer, and the light shielding layer is divided into a plurality of predetermined regions based on a sheet resistance distribution of the light shielding layer, and energizing the light shielding layer includes: connecting a third contact and a fourth contact on the light shielding layer to a positive pole and a negative pole of a power source respectively, wherein the third contact and the fourth contact are located on both sides of an orthographic projection of active layers in the thin film transistors on the light shielding layer.

According to an embodiment of the present disclosure, a deviation between second quantities of heat per unit area of the plurality of predetermined regions is not more than 3%, and a second quantity of heat per unit area is a ratio of heat generated by one of the predetermined regions to an area of the predetermined region.

According to an embodiment of the present disclosure, the step of forming the light shielding layer on the surface of the base substrate includes: adjusting an area of each of the predetermined regions according to a sheet resistance distribution of the light shielding layer, such that the deviation between the second quantities of heat per unit area of the plurality of predetermined regions is not more than 3% when currents flow through the plurality of predetermined regions are the same.

According to an embodiment of the present disclosure, the step of forming the light shielding layer on the surface of the base substrate further includes: forming a conductive layer on a surface of the base substrate; detecting sheet resistance values $R_1, R_2, \ldots, R_n$ at n positions on the conductive layer, and calculating an average sheet resistance value $R_{average}$ of the conductive layer based on the detected sheet resistance values; patterning the conductive layer to form N predetermined regions, an area of the i-th predetermined region being determined based on the formula $S_i'=(R_{average}/R_i) \times S_i$, where $S_i'$ is an actual area of the i-th predetermined region, $S_i$ is a theoretical area of the i-th predetermined region, $R_i$ is the sheet resistance value corresponding to the i-th predetermined region, n is a positive integer, N is a positive integer greater than 1, and i is a positive integer between 1 and N.

According to an embodiment of the present disclosure, energizing the light shielding layer includes: adjusting a current flowing through each of the predetermined regions based on a sheet resistance distribution of the light shielding layer, such that the deviation between the second quantities of heat per unit area of the plurality of predetermined regions is not more than 3%.

According to an embodiment of the present disclosure, energizing the light shielding layer includes: electrically connecting the light shielding layer to a power source through a wire. The method further includes: forming a transition layer at a contact where the light shielding layer contact with the wire, the transition layer encapsulating the contact and a portion of the wire.

According to an embodiment of the present disclosure, the method further includes: forming a first buffer layer between the base substrate and the light shielding layer.

In another aspect of the present disclosure, the present disclosure provides a display substrate fabricated by the above method.

In still another aspect of the present disclosure, the present disclosure provides a display device including the display substrate fabricated by the above method.

DETAILED DESCRIPTION OF THE DISCLOSURE

Embodiments of the present disclosure are described in detail below. The embodiments described below are illustrative only and are not to be construed as limiting the disclosure. Where specific techniques or conditions are not indicated in the embodiments, they are carried out according to the techniques or conditions described in the literature in the art or according to the product specifications. Reagents or instruments that are not indicated by manufacturers are conventional products that can be obtained commercially.

Figure 1:
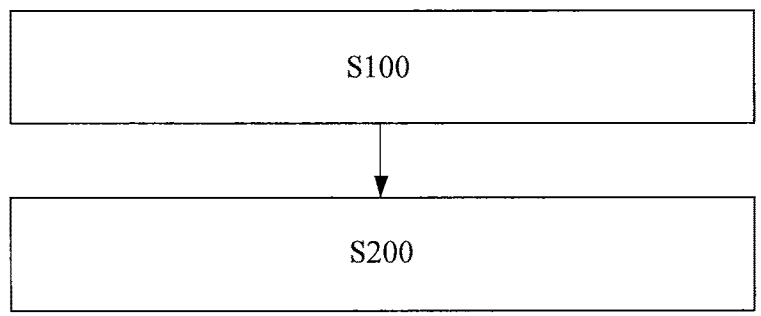
FIG. 1 shows a flow chart of a method for fabricating a display substrate according to an embodiment of the present disclosure.

In one aspect of the disclosure, the present disclosure provides a method for fabricating a display substrate. According to an embodiment of the present disclosure, referring to FIG. 1 and FIG. 2a, FIG. 2b, the method includes the following steps.

Figure 2A:
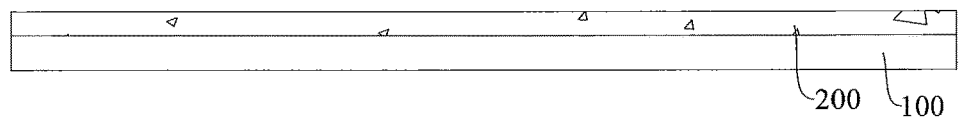
FIGS. 2a and 2b show schematic flow charts of a method for fabricating a display substrate according to an embodiment of the present disclosure.

S100: forming a light shielding layer 200 on a surface of a base substrate 100 (referring to FIG. 2a for a schematic structural diagram).

According to an embodiment of the present disclosure, a process of forming the light shielding layer 200 on a surface of the base substrate 100 may include vacuum evaporation, chemical vapor deposition, spin coating, inkjet printing, or the like. The process parameters of the vacuum evaporation, chemical vapor deposition, spin coating, and inkjet printing are process parameters for conventional vacuum evaporation, chemical vapor deposition, spin coating, and inkjet printing, and will not be further described herein. Thus, the fabricating process is simple, convenient, easy to implement, and easy to industrialize.

Figure 2B:
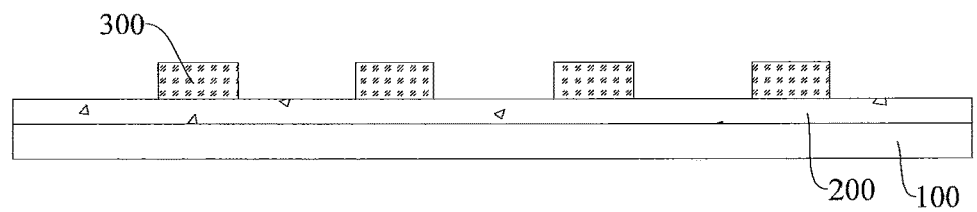

S200: forming a plurality of thin film transistors 300 on a side of the light shielding layer 200 away from the base substrate 100 (referring to FIG. 2b for a structural diagram). It should be noted that, in the drawings herein, only some of the thin film transistors 300 in the display substrate are shown. As will be understood by those skilled in the art, in addition to the thin film transistors 300 illustrated in the drawings, a plurality of thin film transistors that are not shown in the drawings are included in the display substrate described herein).

According to an embodiment of the present disclosure, forming a plurality of thin film transistors on a side of the light shielding layer 200 away from the base substrate 100 may include: forming active layers of the thin film transistors 300, forming gates of the thin film transistors 300, forming sources and drains of the thin film transistors 300, forming gate insulating layers, interlayer insulating layers, and the like. Specific processes may include photolithography, vacuum evaporation, chemical vapor deposition, spin coating, and ink jet printing, etc. The process parameters of the photolithography, vacuum evaporation, chemical vapor deposition, spin coating, and inkjet printing are process parameters for conventional photolithography, vacuum evaporation, chemical vapor deposition, spin coating, and inkjet printing, and are will not be further described herein. Thus, the fabricating process is simple, convenient, easy to implement, and easy to industrialize.

Figure 3:
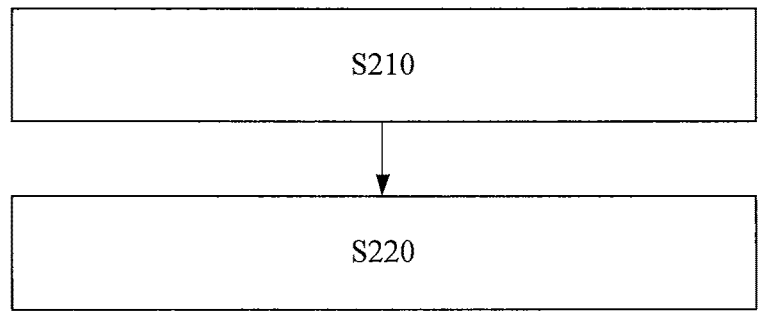
FIG. 3 shows a flow chart of forming active layers of thin film transistors of a display substrate according to an embodiment of the present disclosure.

In the step (S200) of forming a plurality of thin film transistors on a side of the light shielding layer 200 away from the base substrate 100, referring to FIG. 3, forming the active layers 320 of the thin film transistors 300 includes the following steps.

Figure 4A:
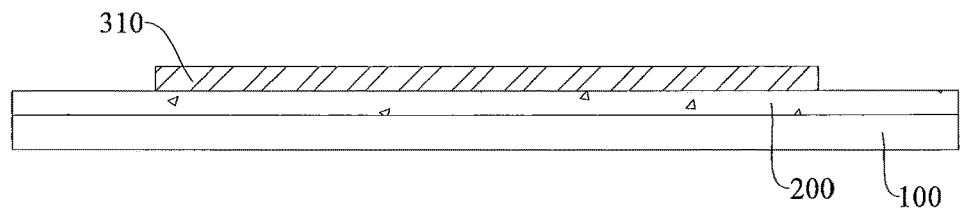
FIGS. 4a and 4b show schematic flow charts of forming active layers of thin film transistors of a display substrate according to an embodiment of the present disclosure.

S210: forming a semiconductor layer at a position where an active layer is to be formed in each of the plurality of thin film transistors (referring to FIG. 4a for a schematic structural diagram).

According to an embodiment of the present disclosure, materials of the semiconductor layer 310 may include amorphous semiconductor materials such as amorphous silicon, amorphous indium gallium zinc oxide (IGZO), and various crystallization-defective semiconductor materials. Thus, the material source is wide, easy to obtain, and the cost is low, and the formed thin film transistors 300 have good electrical properties and is suitable for crystallization by heat.

According to an embodiment of the present disclosure, a process of forming the semiconductor layer 310 may include vacuum evaporation, chemical vapor deposition, or the like. The process parameters of the vacuum evaporation, chemical vapor deposition are process parameters for conventional vacuum evaporation, chemical vapor deposition, and will not be further described herein. Thus, the fabricating process is simple, convenient, easy to implement, and easy to industrialize.

Figure 4B:
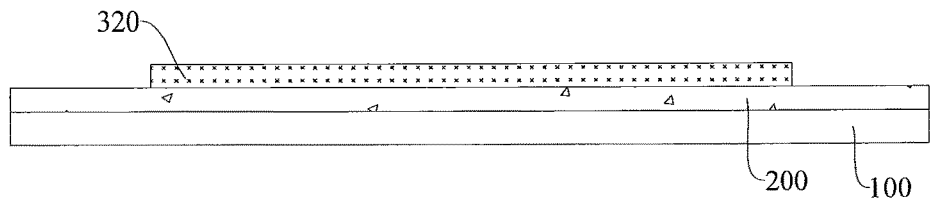
Figure 5A:
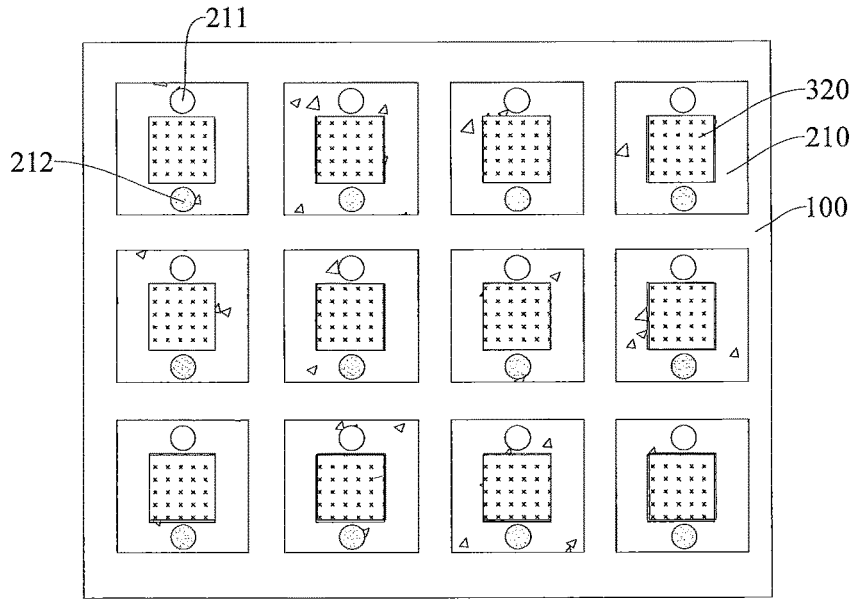
FIGS. 5a, 5b, 5c, and 5d show schematic plan views of a light shielding layer when the light shielding layer is energized according to some embodiments of the present disclosure.
Figure 5B:
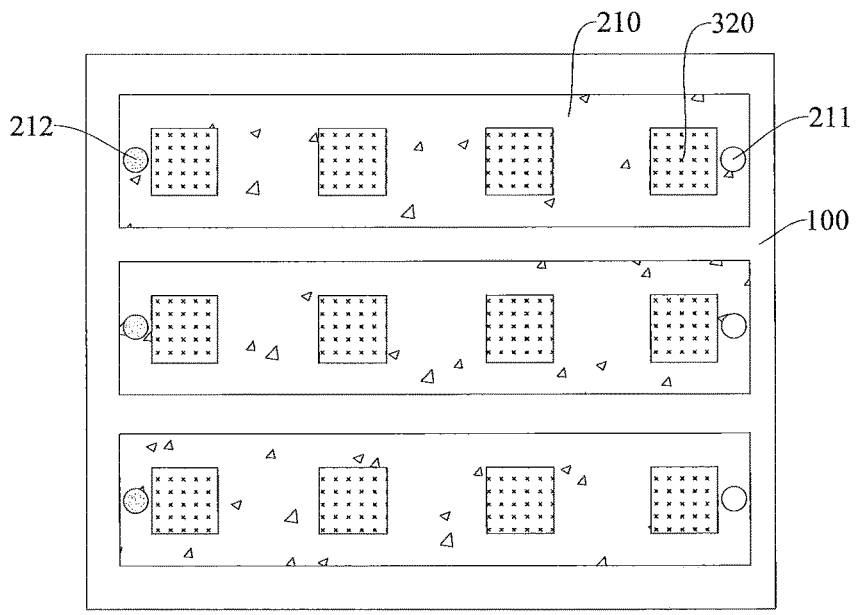
Figure 5C:
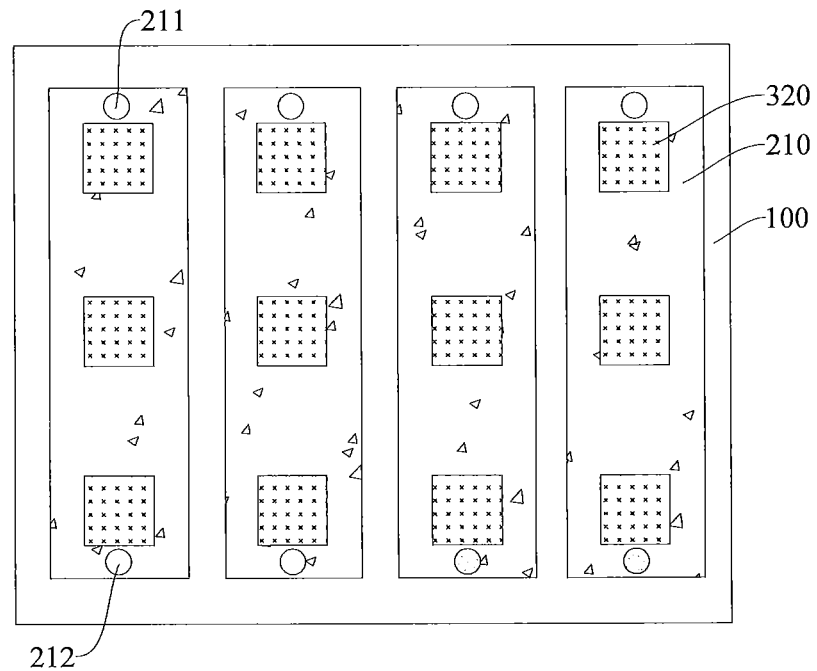
Figure 5D:
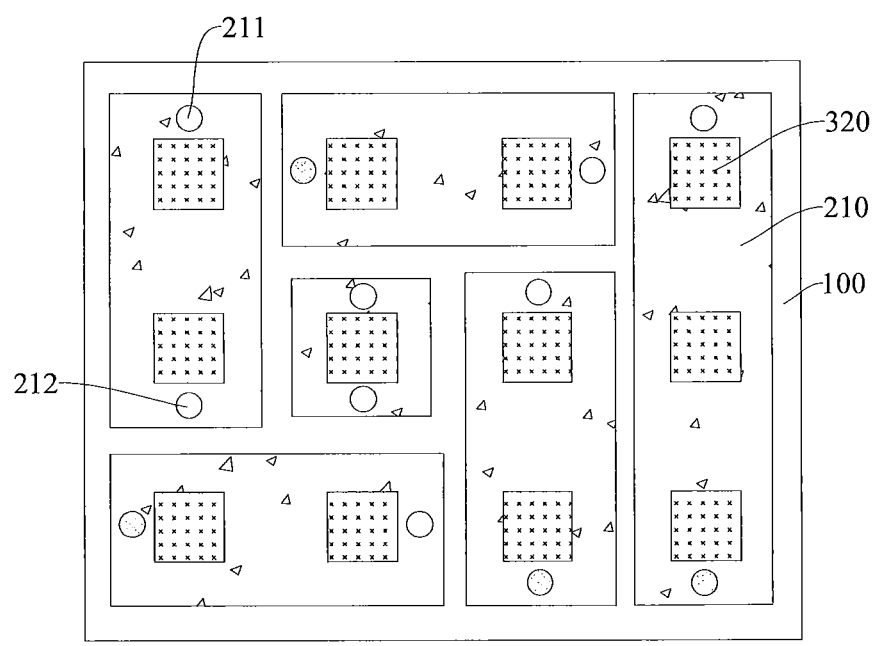
Figure 6:
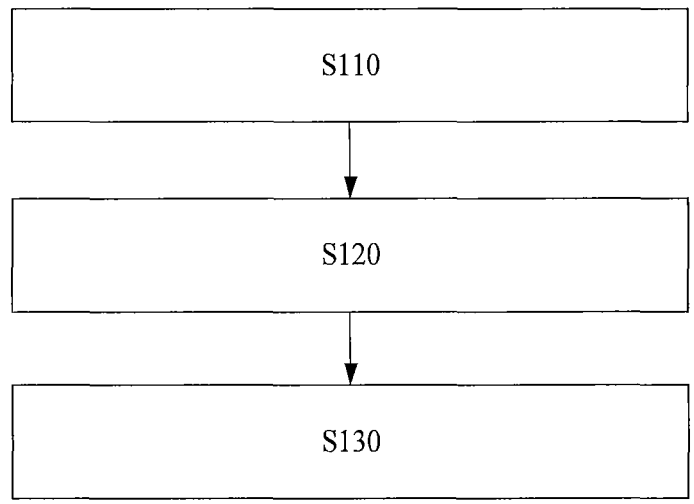
FIG. 6 shows a flow chart of forming a light shielding layer according to an embodiment of the present disclosure.

S220: generating heat using the light shielding layer 200, and utilizing the heat to crystallize the semiconductor layer 310 (referring to FIG. 4b for a schematic structural diagram).

According to an embodiment of the present disclosure, the entire crystallization process is a crystallization process using a thermal effect. In the process of crystallizing the semiconductor layer 310, the temperature gradient of the surface of the semiconductor layer 310 is much smaller than the temperature gradient of the surface of the semiconductor layer when the semiconductor layer is crystallized by the excimer laser technology in the related art, therefore, when the layer 310 is crystallized, the grain sizes are uniform, the production efficiency is high, the process is controllable, and the cost is low, and the process can be applied to a high generation line. In addition, the heat is generated directly by the light shielding layer 200 and the semiconductor layer 310 is crystallized by the heat, and the existing structure of the display substrate is fully utilized, and the structural member for generating heat is not required to be additionally provided, the operation is simple, convenient, easy to implement and easy to industrialize. Meanwhile, after the display substrate is completed, the function of the light shielding layer 200 is only to shield light, so that the heat generated by the light shielding layer 200 does not adversely affect the electrical performance of the display substrate, and the performance of the resulting display substrate is good.

According to an embodiment of the present disclosure, when the material forming the light shielding layer 200 includes a conductive material, a specific manner of generating heat using the light shielding layer 200 may be to energize the light shielding layer. Thereby, the operation is simple, convenient, easy to implement, and easy to industrialize.

According to an embodiment of the present disclosure, the material of the light shielding layer 200 may include a metal material. In some specific embodiments of the present disclosure, the material of the light shielding layer 200 may be a metal or an alloy of molybdenum, aluminum, copper, tungsten, or the like. Therefore, the heat generated by the light shielding layer 200 when the light shielding layer 200 is energized is relatively stable and easy to control, so that the temperature gradient of the surface of the semiconductor layer 310 is further reduced during the crystallization of the semiconductor layer 310. Further, the grain sizes formed during the crystallization of the semiconductor layer 310 are uniform and the production efficiency is high. In addition, these metal materials are widely available, easy to obtain, and have low cost and good shading effect.

In some embodiments of the present disclosure, the light shielding layer 200 may be energized in a pulsed manner, and the duration of each energization may be 1-800 microseconds, and the number of energization may be 1-100 times. In some specific embodiments of the present disclosure, the duration for the light shielding layer 200 to be energized in a single time may be 1 microsecond, 10 microseconds, 50 microseconds, 100 microseconds, 200 microseconds, 500 microseconds, etc.; the number of times the light shielding layer 200 is energized may be 1, 10, 20, 50, 100, or the like. Thereby, the energization duration is short, the heating process is short, and the base substrate 100 is not adversely affected. The voltage applied to the light shielding layer 200 may be 1000-1000000V. In some specific embodiments of the present disclosure, the voltage applied to the light shielding layer 200 may be 1000 V, 5000 V, 10000 V, 50000 V, 200000 V, 500000 V, 1000000 V, and the like. The current passing through the light shielding layer 200 may be 10 mA to 1000 A. In some specific embodiments of the present disclosure, the current passing through the light shielding layer 200 may be 10 mA, 50 mA, 100 mA, 1 A, 10 A, 100 A, 500 A, 1000 A, or the like. Thus, the operation is simple, convenient, easy to implement, and easy to industrialize.

In some embodiments of the present disclosure, referring to FIG. 5a, FIG. 5b, FIG. 5c, and FIG. 5d, the light shielding layer 200 includes a plurality of sub-light shielding layers 210 disposed at intervals, and the plurality of thin film transistors include a plurality of thin film transistor groups. An orthographic projection of each of the plurality of sub-light shielding layers 210 on the base substrate 100 covers an orthographic projection of the active layers 320 in a corresponding thin film transistor group on the base substrate 100, each of the plurality of thin film transistor groups includes at least one thin film transistor (it is to be noted that only the active layer 320 of the thin film transistor is shown in the drawings). In some embodiments of the present disclosure, each of the plurality of thin film transistor groups may include one thin film transistor, and an orthographic projection of each of the plurality of sub-shielding layers 210 on the base substrate 100 covers an orthographic projection of the active layer 320 of the one thin film transistor on the base substrate 100 (referring to FIG. 5a for a schematic structural diagram). In some other embodiments of the present disclosure, each of the plurality of thin film transistor groups may include a plurality of thin film transistors, and an orthographic projection of each of the plurality of sub-shielding layers 210 on the base substrate 100 covers an orthographic projection of the active layers 320 of a plurality of thin film transistors on the base substrate 100, the sub-light shielding layer 210 may be disposed laterally (referring to FIG. 5b for a schematic structural diagram), vertically (referring to FIG. 5c for a schematic structural diagram), or irregularly (referring to FIG. 5d for a structural diagram). It should be noted that the shape of the sub-light shielding layer 210 shown in the drawings of the present disclosure is merely exemplified, and the specific shape of the sub-light shielding layer 210 is not limited, and the shape of the light shielding layer 210 in the present disclosure may be disposed according to actual needs. For example, the shape of the sub-light shielding layer 210 may be disposed to a circular shape, an irregular shape, or a shape with a hollowed-out region in the middle, thereby preventing the sub-light shielding layer 210 from adversely affecting electrical performance of the thin film transistor. In addition, a plurality of the sub-shielding layers 210 are spaced apart from each other, and the parasitic capacitance generated between the gate and the source/drain in the thin film transistor can also be reduced, so that the electrical performance of the thin film transistor is good.

In the above embodiments, referring to FIG. 5a, FIG. 5b, FIG. 5c, and FIG. 5d, energizing the light shielding layer 200 includes: connecting a first contact 211 and a second contact 211 of each of the plurality of sub-light shielding layers 210 to a positive pole and a negative pole of a power source respectively (not shown in drawings), wherein the first contact 211 and the second contact 212 are located on both sides of the orthographic projection of the active layers 320 in the corresponding one of the thin film transistor groups on the light shielding layer 200, the active layers 320 may not cover the first contact 211 and the second contact 212, and may cover the first contact 211 and/or the second contact 212. Therefore, the grain sizes formed during the crystallization of the semiconductor layer 310 are uniform and the production efficiency is high, and the operation is simple, convenient, easy to implement, and easy to industrialize.

According to an embodiment of the present disclosure, in the step of forming the light shielding layer 200, an area of each of the plurality of sub-light shielding layers 210 may be adjusted based on a sheet resistance distribution of the light shielding layer 200, such that the deviation between the first quantities of heat per unit area of the plurality of sub-shielding layers 210 is not more than 3% when currents flow through the plurality of sub-shielding layers 210 are the same (it is to be noted that the deviation herein is calculated based on a formula: deviation=(The maximum-minimum value)/(maximum value+minimum value)), and a first quantity of heat per unit area is a ratio of heat generated by one of the sub-shielding layers 210 to an area of the sub-shielding layer 210. In this way, in the process of crystallizing the semiconductor layer 310, the temperature of the surface of the semiconductor layer 310 is uniform, so that the grain sizes formed when the semiconductor layer 310 is crystallized are of high uniformity.

In some embodiments of the present disclosure, referring to FIG. 6, FIG. 7a, FIG. 7b, FIG. 8a, FIG. 8b, FIG. 9a, FIG. 9b, FIG. 10a and FIG. 10b, adjusting the area of each of the plurality of sub-light shielding layers 210 based on the sheet resistance distribution of the light shielding layer 200 may include the following steps.

S110: forming a conductive layer 199 on a surface of the base substrate 100 (referring to FIG. 7a, FIG. 8a, FIG. 9a, FIG. 10a for schematic structural diagrams).

According to an embodiment of the present disclosure, a process of forming the conductive layer 199 on a surface of the base substrate 100 may include vacuum evaporation, chemical vapor deposition, spin coating, inkjet printing, or the like. The process parameters of the vacuum evaporation, chemical vapor deposition, spin coating, and inkjet printing are process parameters for conventional vacuum evaporation, chemical vapor deposition, spin coating, and inkjet printing, and will not be further described herein. Thus, the fabricating process is simple, convenient, easy to implement, and easy to industrialize.

S120: detecting sheet resistance values $R_1, R_2, \ldots, R_n$ of the n positions on the conductive layer 199, and calculating an average sheet resistance value $R_{average}$ of the conductive layer 199 based on the detected sheet resistance values (referring to FIG. 7a, FIG. 8a, FIG. 9a, and FIG. 10a for schematic structural diagrams). It should be noted that, in FIG. 7a, FIG. 8a, FIG. 9a, and FIG. 10a, n is equal to 1, 2, 3, 4, and 6, respectively, but this does not mean that the value of n in the disclosure is limited, and in the present disclosure, n may be any positive integer).

According to an embodiment of the present disclosure, detecting the sheet resistance values $R_1, R_2, \ldots, R_n$ of the n positions on the conductive layer 199 may be performed by using a sheet resistance test device, which is the same as a conventional sheet resistance test method, and will not be further described herein. The average sheet resistance value $R_{average}$ of the conductive layer 199 is calculated as $R_{average}=(R_1+R_2+R_3+\ldots+R_n)/n$.

According to an embodiment of the present disclosure, the positions may be selected according to actual conditions. During the fabrication of the conductive layer 199, the fabricating device may affect the uniformity of the thickness of the conductive layer 199, thereby affecting the uniformity of the sheet resistance values at various points on the surface. The positions can be selected based on the thickness distribution of the conductive layer 199, as long as the average sheet resistance value $R_{average}$ of the conductive layer 199 calculated based on the selected positions can represent the average resistance value of the entire conductive layer 199. There is no particular limitation on the number, distribution, and the like for the selected positions.

Figure 11:
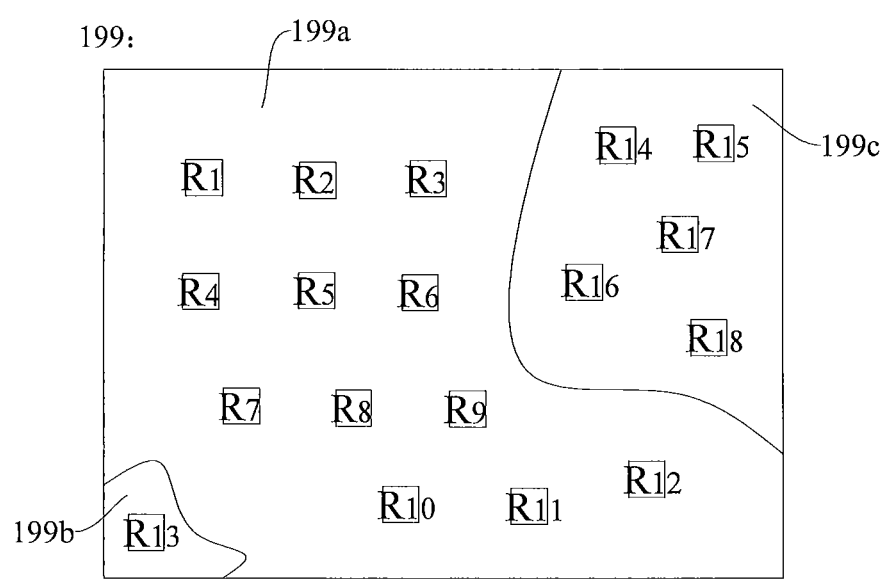
FIG. 11 shows a plan view showing a surface resistance distribution of a conductive layer and a corresponding rule of a selected contact point according to an embodiment of the present disclosure.

The rule of selecting positions will be described in detail below by taking the conductive layer 199 in FIG. 11 as an example. Specifically, under a condition that a specified device and parameters are employed, the sheet resistance distribution of the obtained conductive layer is uniform (the factors affecting the resistance distribution of the conductive layer mainly are the thickness of the conductive layer, and the crystallization degree of the material forming the conductive layer), then the test positions can be selected based on the sheet resistance distribution of the conductive layer. For example, referring to FIG. 11, under the condition that a specified device and parameters are employed, the sheet resistance of the resulting conductive layer 199 can be roughly divided into a first sub-region 199a, a second sub-region 199b, and a third sub-region 199c. The sheet resistance distribution of the conductive layers in the three sub-regions 199a, 199b, and 199c is uniform, that is, the sheet resistance values of the positions in the first sub-region 199a are the same, and the sheet resistance values of the positions in the second sub-region 199b are the same, and the sheet resistance values of the positions in the third sub-region 199c are the same. In this embodiment, the area of the first sub-region 199a is S199a, the area of the second sub-region 199b is S199b, and the area of the third sub-region 199c is S199c. As can be seen from FIG. 11, S199a>S199c>S199b, therefore, more positions ($R_1$-$R_{12}$) should be selected in the first sub-region 199a, and the number of positions ($R_{14}$-$R_{18}$) selected in the third sub-region 199c should be less, and the number of positions ($R_{13}$) selected in the second sub-region 199b should be least. Thus, the average sheet resistance value $R_{average}$ of the conductive layer 199 calculated based on the selected positions can accurately represent the average sheet resistance value of the entire conductive layer 199. And as described above, the sheet resistance distribution in the three sub-regions is uniform, so in the subsequent step of determining the area of each sub-light shielding layer, the area of the corresponding sub-light shielding layer formed by the first sub-region 199a may be calculated based on the sheet resistance value corresponding to any position in the first sub-region 199a, and this also applies to the second sub-region 199b and the third sub-region 199c.

S130: patterning the conductive layer 199 to form M sub-shielding layers 210, an area of the i-th sub-shielding layer 210 being determined based on the formula $A_i' = (R_{average}/R_i) \times A_i$, where $A_i'$ is an actual area of the i-th sub-shielding layer 210, $A_i$ is a theoretical area of the i-th sub-shielding layer 210, $R_i$ is the sheet resistance value corresponding to the i-th sub-shielding layer 210, n is a positive integer, M is a positive integer greater than 1, and i is a positive integer between 1 and M (referring to FIG. 7b, FIG. 8b, FIG. 9b, FIG. 10b for schematic structural diagrams). It should be noted that the theoretical area refers to the area of the sub-shielding layer 210 when the sheet resistance distribution of the surface of the conductive layer 199 is not considered, and the actual area refers to the area of the sub-shielding layer after adjusting the theoretical area based on the sheet resistance distribution of the conductive layer.

Figure 7A:
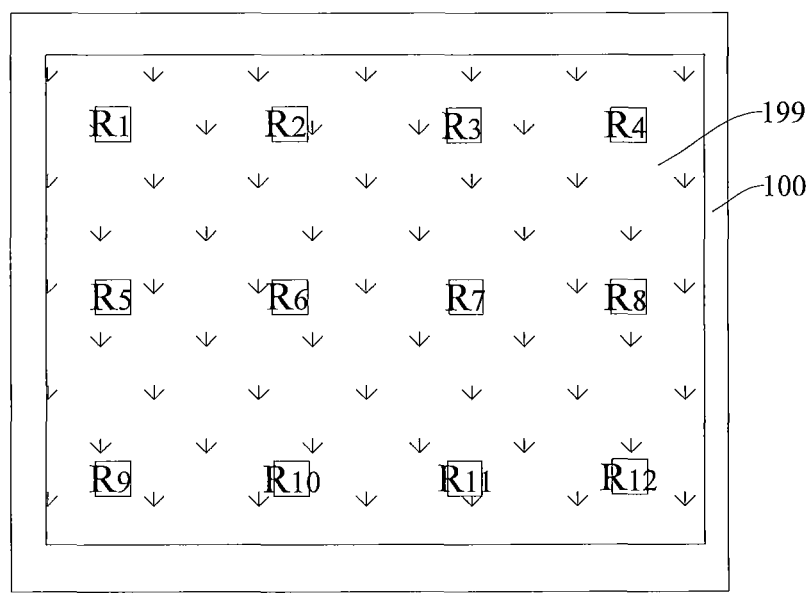
FIGS. 7a and 7b show schematic flow charts of forming a light shielding layer according to an embodiment of the present disclosure.
Figure 7B:
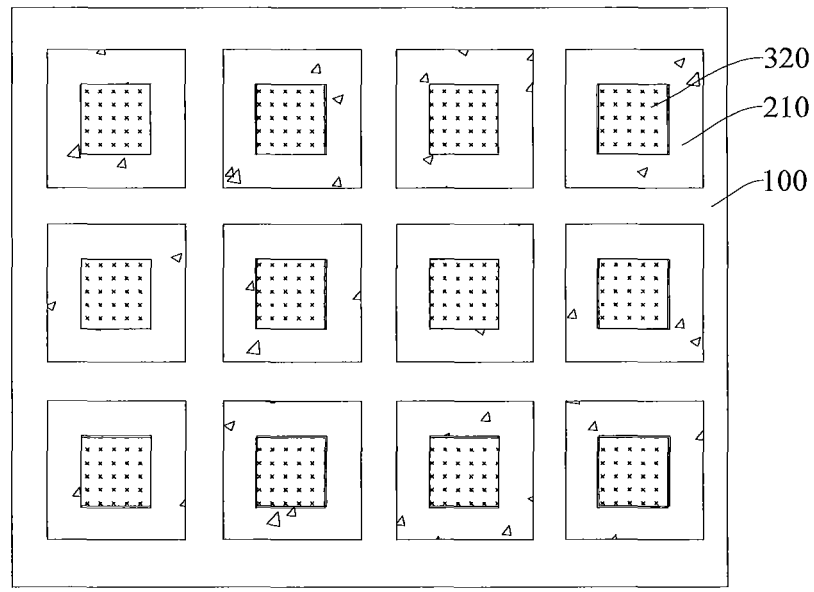

According to an embodiment of the present disclosure, after the conductive layer is patterned to form M sub-shielding layers, the actual area of the i-th sub-shielding layer 210 is determined based on the formula $A_i'=(R_{average}/R_i) \times A_i$. The sub-shielding layers 210 shown in FIG. 7b will be described in detail below as an example. Referring to FIG. 7b, the theoretical areas of the plurality of sub-shielding layers 210 shown in FIG. 7b should be equal without considering the sheet resistance distribution of the conductive layer 199. However, in the actual fabrication process, due to various reasons such as processes and parameters, the sheet resistance values of different points on the surface of the conductive layer 199 are slightly different, and the uniformity and consistency of quantities of heat per unit area of the plurality of sub-shielding layers 210 cannot be guaranteed if the plurality of sub-shielding layers 210 are directly formed based on the theoretical area of each of the plurality of sub-shielding layers 210. Based on this, the inventors creatively utilized the difference between the areas forming the plurality of sub-shielding layers 210 to compensate for the unevenness of heat generation due to the unevenness of the resistance distribution of the conductive layer 199, thereby making the heats generated by the plurality of sub-shielding layers are uniform, and grain sizes of the obtained polycrystalline silicon are of high uniformity. Thereby, the difference in the sheet resistance values of the plurality of sub-shielding layers 210 is compensated by the difference between the actual areas of the plurality of sub-shielding layers 210, so that the deviation between the first quantities of heat per unit area of the plurality of sub-shielding layers 210 can be made not more than 3%, thereby further making the temperature of the surface of the semiconductor layer 310 uniform during the crystallization of the semiconductor layer 310. Therefore, when the layer 310 is crystallized, the grain sizes are uniform.

Figure 8A:
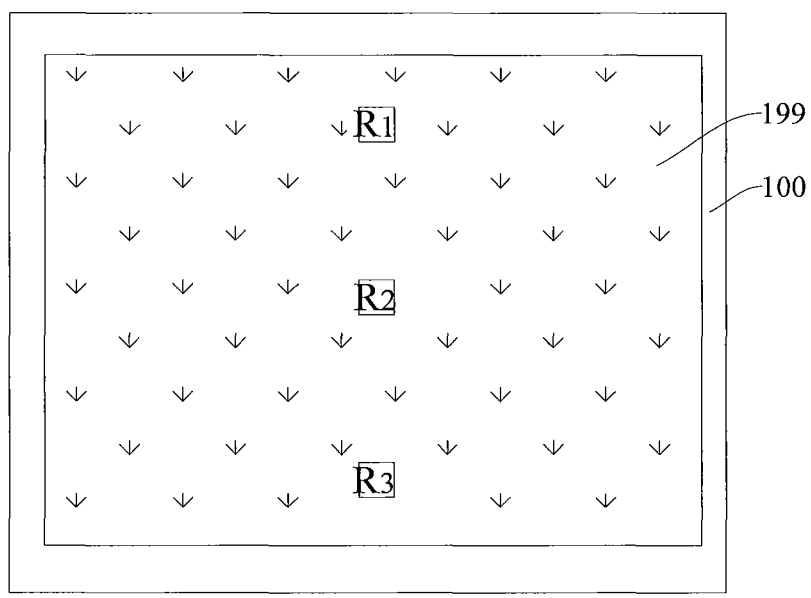
FIGS. 8a and 8b show schematic flow charts of forming a light shielding layer according to an embodiment of the present disclosure.
Figure 8B:
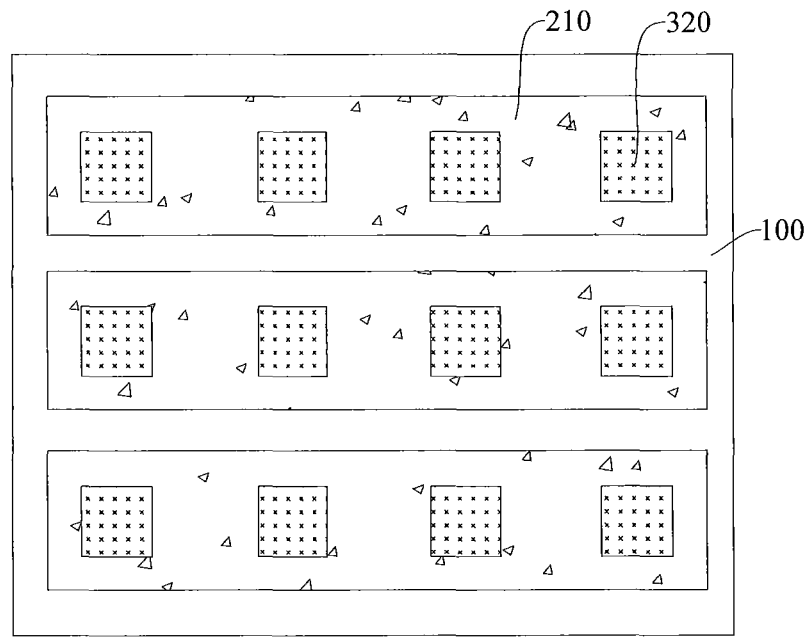
Figure 9A:
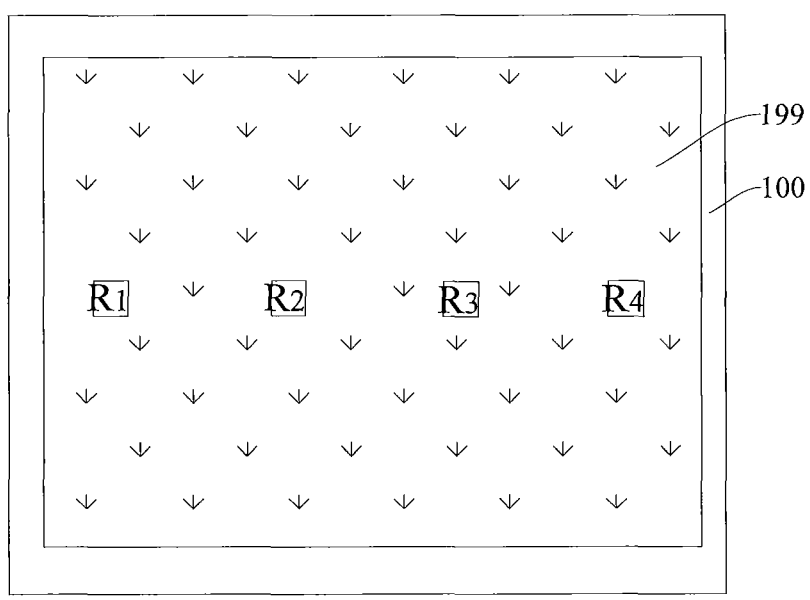
FIGS. 9a and 9b show schematic flow charts of forming a light shielding layer according to an embodiment of the present disclosure.
Figure 9B:
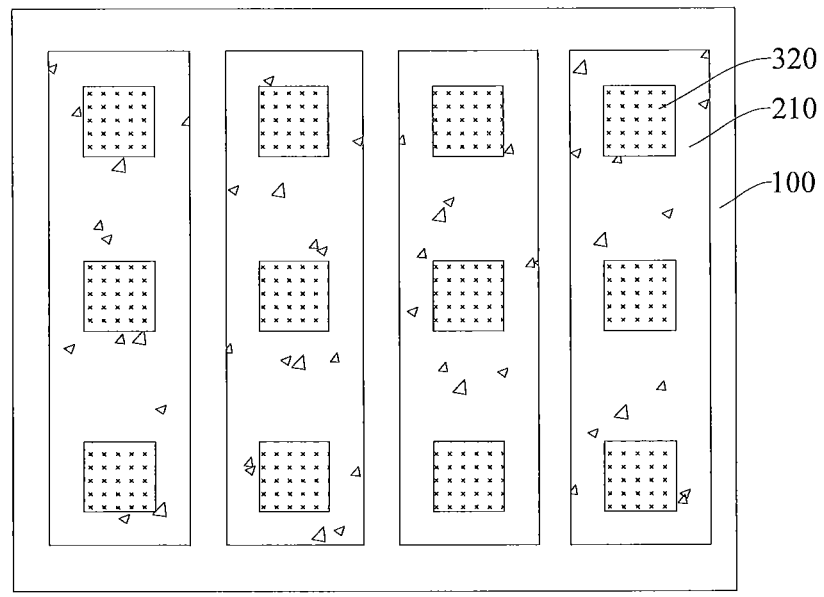
Figure 10A:
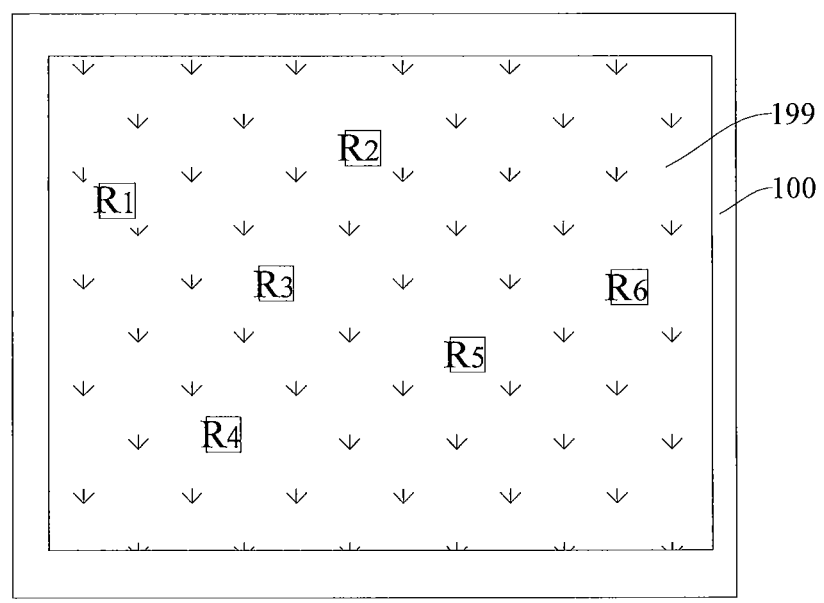
FIGS. 10a and 10b show schematic flow charts of forming a light shielding layer according to an embodiment of the present disclosure.
Figure 10B:
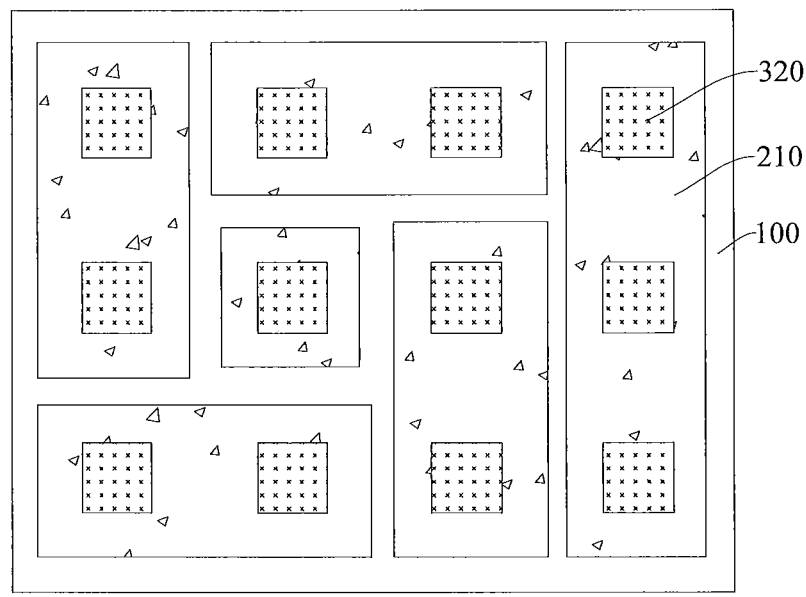

It should be noted that, like the plurality of sub-shielding layers shown in FIG. 7b, the theoretical areas of the plurality of sub-shielding layers shown in FIG. 8b and FIG. 9b are also equal, and the theoretical areas of the plurality of sub-shielding layers shown in FIG. 10b are not completely the same. As can be seen from FIG. 10b, the numbers of orthographic projections of the active layers on the base substrate covered by the orthographic projections of the plurality of sub-shielding layers on the base substrate are different, so the theoretical areas are inevitably different. Only when the numbers of orthographic projections of the active layers on the substrate covered by the orthographic projections of different sub-shielding layers on the substrate are the same, the theoretical areas of different sub-shielding layers are the same. The specific theoretical areas are determined based on the product design needs.

According to further embodiments of the present disclosure, a current flowing through each of the plurality of sub-light shielding layers may be adjusted based on a sheet resistance distribution of the light shielding layer, such that the deviation between the first quantities of heat per unit area of the plurality of sub-shielding layers 210 is not more than 3%. In this way, in the process of crystallizing the semiconductor layer 310, the temperature of the surface of the semiconductor layer 310 is uniform, so that the grain sizes formed when the semiconductor layer 310 is crystallized are of high uniformity.

Figure 12:
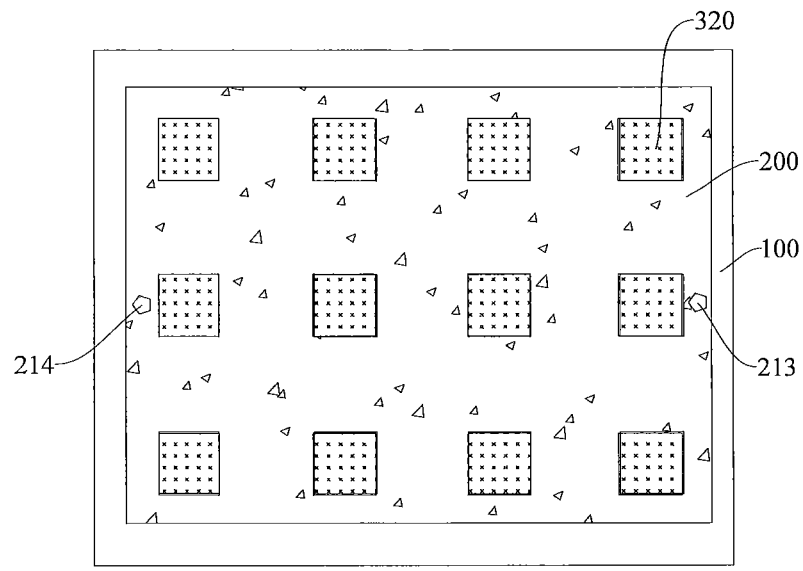
FIG. 12 shows a schematic plan view of a light shielding layer when the light shielding layer is energized according to an embodiments of the present disclosure.

In other embodiments of the present disclosure, referring to FIG. 12, the plurality of thin film transistors 300 share a light shielding layer 200, and the light shielding layer is divided into a plurality of predetermined regions based on a sheet resistance distribution of the light shielding layer (referring to FIG. 13 for a schematic structural diagram), and energizing the light shielding layer 200 may include: connecting a third contact 213 and a fourth contact 214 on the light shielding layer 200 to a positive pole and a negative pole of a power source respectively (not shown in the drawings), wherein the third contact 213 and the fourth contact 214 are located on both sides of the orthographic projection of the active layers 320 of the plurality of thin film transistors on the light shielding layer 200, the active layers 320 may not cover third contact 213 and the fourth contact 214, and may cover the third contact 213 and/or the fourth contact 214. Therefore, the grain sizes formed during the crystallization of the semiconductor layer 310 are uniform and the production efficiency is high, and the operation is simple, convenient, easy to implement, and easy to industrialize.

According to an embodiment of the present disclosure, in the step of forming the light shielding layer 200, an area of each of the predetermined regions may be adjusted based on a sheet resistance distribution of the light shielding layer 200, such that the deviation between the second quantities of heat per unit area of the plurality of predetermined regions is not more than 3% when currents flow through the plurality of predetermined regions are the same, and a second quantity of heat per unit area is a ratio of heat generated by one of the predetermined regions to an area of the predetermined region. In this way, in the process of crystallizing the semiconductor layer 310, the temperature of the surface of the semiconductor layer 310 is uniform, so that the grain sizes formed when the semiconductor layer 310 is crystallized are of high uniformity.

According to an embodiment of the present disclosure, referring to FIG. 7a, FIG. 8a, FIG. 9a, FIG. 10a, and FIG. 13, adjusting the area of each of the predetermined regions based on the sheet resistance distribution of the light shielding layer 200 may include the following steps: forming a conductive layer on a surface of the base substrate; detecting sheet resistance values $R_1, R_2, \ldots, R_n$ at n positions on the conductive layer, and calculating an average sheet resistance value $R_{average}$ of the conductive layer based on the detected sheet resistance values; patterning the conductive layer to form N predetermined regions, an area of the i-th predetermined region being determined based on the formula $S_i' = (R_{average}/R_i) \times S_i$, where $S_i'$ is an actual area of the i-th predetermined region, $S_i$ is a theoretical area of the i-th predetermined region, $R_i$ is the sheet resistance value corresponding to the i-th predetermined region, n is a positive integer, N is a positive integer greater than 1, and i is a positive integer between 1 and N.

Figure 13:
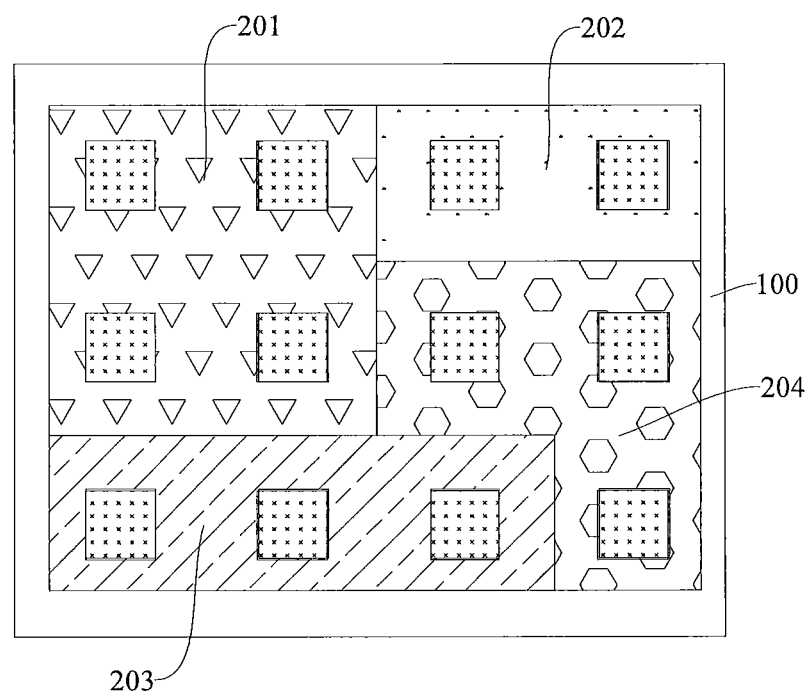
FIG. 13 shows a schematic plan view of a light shielding layer when the light shielding layer is energized according to an embodiments of the present disclosure.

It should be noted that, the light shielding layer is divided into four predetermined regions (i.e. a first predetermined region 201, a second predetermined region 202, a third predetermined region 203, and a fourth predetermined region 204) in FIG. 13 as an example, but this does not mean a limitation to the number of predetermined regions in the present disclosure. Those skilled in the art can understand that the light shielding layer 200 can be divided into any number of predetermined regions based on the sheet resistance distribution of the light shielding layer 200.

According to an embodiment of the present disclosure, dividing the light shielding layer 200 into a plurality of predetermined regions based on the sheet resistance distribution of the light shielding layer 200 may include the following steps: detecting the sheet resistance values $R_1, R_2, \ldots, R_n$ on n positions on the conductive layer 199, and dividing the positions with sheet resistance values within a range of 3% deviation into a same predetermined region. Detecting the sheet resistance values $R_1, R_2, \ldots, R_n$ of the n positions on the conductive layer 199 may be performed by using a sheet resistance test device, which is the same as a conventional sheet resistance test method, and will not be further described herein.

According to further embodiments of the present disclosure, a current flowing through each of the plurality of predetermined regions may be adjusted based on a sheet resistance distribution of the light shielding layer, such that the deviation between the second quantities of heat per unit area of the plurality of predetermined regions is not more than 3%. In this way, in the process of crystallizing the semiconductor layer 310, the temperature of the surface of the semiconductor layer 310 is uniform, so that the grain sizes formed when the semiconductor layer 310 is crystallized are of high uniformity.

According to embodiments of the present disclosure, when a predetermined region is connected to a power source, two opposite connection positions in the predetermined region are connected to the positive and negative poles of the power source. The current flowing between the two opposite connection positions usually selects the shortest path to flow, so the intensity of the current passing between the two opposite connection positions is usually much higher than the intensity of the current passing through parts not in between the two connection positions. When a predetermined region is connected to the power source, by appropriately disposing the positions where the positive and negative poles of the power source are connected to the predetermined region, only the current generated by the power source in this predetermined region can be considered, and the currents generated by the power source in other predetermined regions are negligible. That is to say, in the present disclosure, it is approximated that currents passing through different predetermined regions are independent of each other and do not interfere with each other. In some embodiments of the present disclosure, a plurality of the predetermined regions may be subsequently connected to power sources different in current respectively, thereby further ensuring currents passing between the respective predetermined regions not to interfere with each other, so that the deviation between the second quantities of heat per unit area of the plurality of predetermined region is small.

According to an embodiment of the present disclosure, with reference to FIG. 13, the light shielding layer is divided into four predetermined regions (i.e. a first predetermined region 201, a second predetermined region 202, a third predetermined region 203, and a fourth predetermined region 204) as an example. The first predetermined region 201, the second predetermined region 202, the third predetermined region 203, and the fourth predetermined region 204 are connected to power sources having different currents, such that the currents $I_{201}, I_{202}, I_{203},$ and $I_{204}$ flow through the first predetermined region 201, the second predetermined region 202, the third predetermined region 203 and the fourth predetermined region 204 are different. The areas of the first predetermined region 201, the second predetermined region 202, the third predetermined region 203, and the fourth predetermined region 204 are defined as $S_{201}, S_{202}, S_{203},$ and $S_{204}$, respectively. The deviation between the heats of the second unit area of the first predetermined region 201, the second predetermined region 202, the third predetermined region 203, and the fourth predetermined region 204 is not more than 3%, that is, The deviation between the values of $(I_{201}^2 \times R_{201})/S_{201}$, $(I_{202}^2 \times R_{202})/S_{202}$, $(I_{203}^2 \times R_{203})/S_{203}$, and $(I_{204}^2 \times R_{204})/S_{204}$ is not more than 3%. Therefore, in the process of crystallizing the semiconductor layer 310, the deviation between the heats of the second unit area of the plurality of predetermined regions is not more than 3%, and the temperature of the surface of the semiconductor layer 310 is uniform, so that the grain sizes formed when the semiconductor layer 310 is crystallized are of high uniformity.

Figure 14:
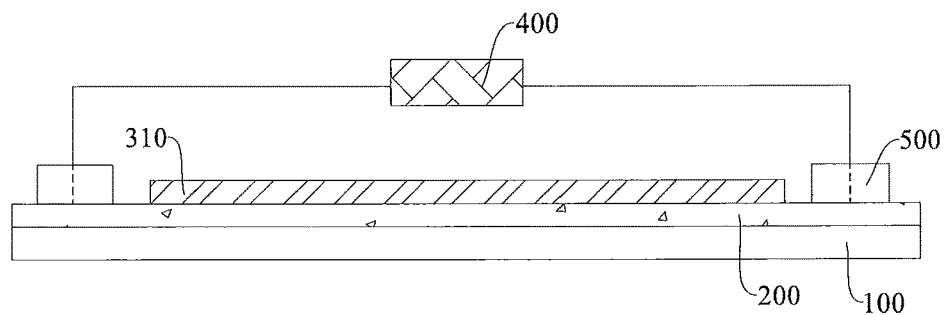
FIG. 14 shows a schematic plan view of a light shielding layer when the light shielding layer is energized according to an embodiments of the present disclosure.

According to an embodiment of the present disclosure, a light shielding layer 200 may be electrically connected to a power source 400 through a wire. Referring to FIG. 14, the method further includes: forming a transition layer 500 at a contact where the light shielding layer 200 contact with the wire, the transition layer 500 encapsulating the contact and a portion of the wire (it is to be noted that, in FIG. 14, a dotted line portion is a portion of the wire covered by the transition layer 500, and an intersection of the dotted line with the light shielding layer 200 is a contact). Thus, it can prevent abnormal discharge when the light shielding layer 200 is energized.

According to an embodiment of the present disclosure, a material of the transition layer 500 may include amorphous silicon or indium tin oxide (ITO), or the like. Thus, the material source is wide, easy to obtain, and the cost is low, and the effect of preventing abnormal discharge when the light shielding layer 200 is energized is good.

Figure 15:
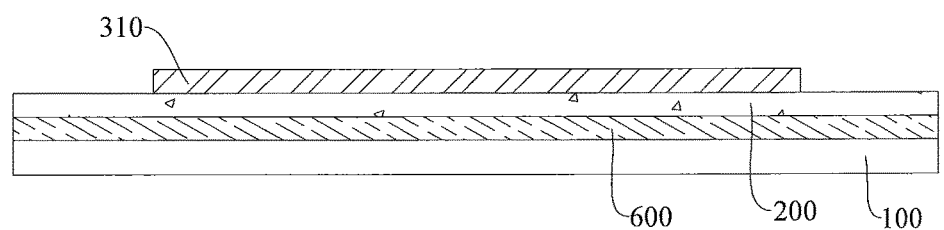
FIG. 15 shows a schematic flow chart of a method for fabricating a display substrate according to an embodiment of the present disclosure.

According to an embodiment of the present disclosure, referring to FIG. 15, the method for fabricating a display substrate further includes: forming a first buffer layer 600 between the base substrate 100 and the light shielding layer 200. Thus, it can prevent the base substrate 100 from softening during the fabrication of the display substrate, thereby making the display substrate high in yield and easy to industrialize.

According to an embodiment of the present disclosure, a material of the first buffer layer 600 may include silicon nitride ($SiN_x$), silicon oxide ($SiO_x$), or the like. Thus, the material source is wide, easy to obtain, and the cost is low, and the base substrate 100 can be effectively prevented from softening during the fabrication process of the display substrate, so that the yield of the display substrate is high and the industrialization is easy.

According to an embodiment of the present disclosure, the fabrication process of the first buffer layer 600 may include vacuum evaporation, chemical vapor deposition, spin coating, inkjet printing, and the like. The process parameters of the vacuum evaporation, chemical vapor deposition, spin coating, and inkjet printing are process parameters for conventional vacuum evaporation, chemical vapor deposition, spin coating, and inkjet printing, and will not be further described herein. Thus, the fabricating process is simple, convenient, easy to implement, and easy to industrialize.

In another aspect of the disclosure, the present disclosure provides a display substrate. According to embodiments of the present disclosure, the display substrate is fabricated by the method described above. The display substrate has good performance and is suitable for a large-sized display panel, and the method for fabricating the display substrate is simple, convenient, easy to implement, easy to industrialize, high in efficiency, controllable in process, and low in cost.

Figure 16:
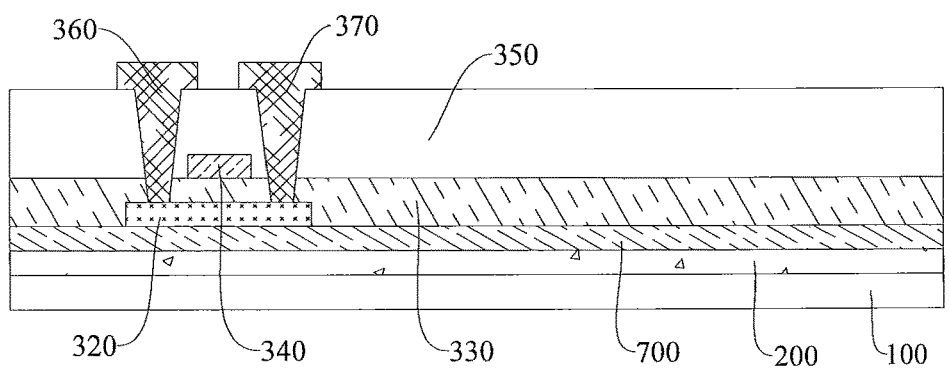
FIG. 16 shows a schematic cross-sectional view of a display substrate according to an embodiment of the present disclosure.

According to an embodiment of the present disclosure, referring to FIG. 16, the display substrate includes: a base substrate 100; a light shielding layer 200 disposed on a surface of the base substrate 100; a second buffer layer 700 disposed on a surface of the light shielding layer 200 away from the base substrate 100, wherein a material of the second buffer layer 700 may include silicon nitride ($SiN_x$), silicon oxide ($SiO_x$), and the like; and a thin film transistor including an active layer 320, a gate insulating layer 330, a gate 340, an interlayer insulating layer 350, a source 360, and a drain 370. The positional relationship between the active layer 320, the gate insulating layer 330, the gate 340, the interlayer insulating layer 350, the source 360 and the drain 370 in thin film transistor, and the formation method of these layers are all constant with conventional thin film transistors, and will not be described in detail herein.

Figure 17:
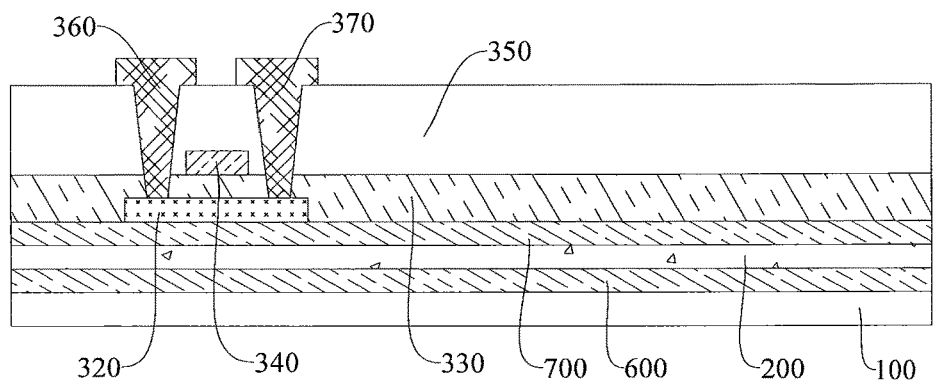
FIG. 17 shows a schematic cross-sectional view of a display substrate according to an embodiment of the present disclosure.

According to an embodiment of the present disclosure, referring to FIG. 17, the display substrate may also include a first buffer layer 600 be between the base substrate 100 and the light shielding layer 200. Thus, the base substrate 100 can be prevented from softening during the fabricating process of the display substrate, so that the yield of the display substrate is high and the industrialization is easy.

In still another aspect of the present disclosure, the present disclosure provides a display device. According to an embodiment of the present disclosure, the display device includes a display substrate fabricated by the method described above. The display device can realize display of a large size and has all the features and advantages of the display substrate described above, and will not be described in detail herein.

According to an embodiment of the present disclosure, the shape, configuration, fabrication process of the display device may be the shape, configuration, and fabrication process of the conventional display device, and those skilled in the art may understand that the display device has the structure of a conventional display device in addition to the display substrate described above, and will not be described again herein.

According to an embodiment of the present disclosure, the display device may include, but is not limited to, a mobile phone, a tablet, a wearable device, a game machine, and the like.

In the description of the present disclosure, it is to be understood that the orientation or positional relationship indicated by the terms "center", "longitudinal", "transverse", "length", "width", "thickness", "upper", "lower", "front", "back", "left", "right", "vertical", "horizontal", "top", "bottom", "inside", "outside", "clockwise", "counterclockwise", "axial", "radial", "circumferential" and the like is based on the orientation or positional relationship shown in the drawings, and is merely for the convenience of describing the present disclosure and simplifying description, and does not indicate or imply that the indicated device or component must be in a particular orientation or be constructed and operated in a particular orientation, and is not to be construed as limiting the disclosure.

Moreover, the terms "first" and "second" are used for descriptive purposes only and are not to be construed as indicating or implying a relative importance or implicitly indicating the number of technical features indicated. Thus, features defining with "first" and "second" may include one or more of the features either explicitly or implicitly. In the description of the present disclosure, the meaning of "a plurality" is two or more unless specifically defined otherwise.

In the present disclosure, unless explicitly stated or defined otherwise, the terms "install", "connect", "fix", and the like, are to be understood broadly, and may be either a fixed connection or a detachable connection, or integrated; may be a mechanical connection, or may be an electrical connection; may be directly connected, or may be indirectly connected through an intermediate medium, may be the internal communication of two elements or the interaction of two elements. The specific meanings of the above terms in the present disclosure can be understood by those skilled in the art on a case-by-case basis.

In the present disclosure, unless explicitly stated and defined otherwise, the first feature "on" or "under" the second feature may be that the first feature and the second feature are directly contacted, or the first and second features may be indirectly contacted through an intermediate medium. Moreover, the first feature "over", "above" and "on" the second feature may be that the first feature is directly above or obliquely above the second feature, or merely that the level of the first feature is higher than the level of the second feature. The first feature "below", "under" and "beneath" the second feature may be that the first feature is directly below or obliquely below the second feature, or merely that the level of the first feature is lower than the level of the second feature.

In the description of the present specification, the description with reference to the terms "one embodiment", "some embodiments", "example", "specific example", or "some examples" and the like means specific features, structures, materials, or characteristics described in connection with the embodiment or example is included in at least one embodiment or example of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be combined without conflicting.

Although the embodiments of the present disclosure have been shown and described above, it is understood that the above embodiments are illustrative and are not to be construed as limiting the scope of the disclosure. Variations, modifications, and substitutions of the above embodiments may be made by those skilled in the art within the scope of the present disclosure.

The invention claimed is:

1. A method for fabricating a display substrate, comprising:
    forming a light shielding layer on a surface of a base substrate; and
    forming a plurality of thin film transistors on a side of the light shielding layer away from the base substrate,
    wherein forming the plurality of thin film transistors on the side of the light shielding layer away from the base substrate comprises:
    forming a semiconductor layer at a position where an active layer is to be formed in each of the plurality of thin film transistors;
    generating heat using the light shielding layer; and
    utilizing the heat to crystallize the semiconductor layer.

2. The method according to claim 1,
    wherein a material of the light shielding layer comprises a conductive material, and
    wherein generating heat using the light shielding layer comprises energizing the light shielding layer.

3. The method according to claim 2,
    wherein the light shielding layer comprises a plurality of sub-light shielding layers disposed at intervals,
    wherein the plurality of thin film transistors comprises a plurality of thin film transistor groups,
    wherein an orthographic projection of each of the plurality of sub-light shielding layers on the base substrate covers an orthographic projection of active layers in a corresponding thin film transistor group on the base substrate,
    wherein each of the plurality of thin film transistor groups comprises at least one of the plurality of thin film transistors,
    wherein energizing the light shielding layer comprises connecting a first contact and a second contact of each of the plurality of sub-light shielding layers to a positive pole and a negative pole of a power source respectively, and
    wherein the first contact and the second contact are on both sides of the orthographic projection of the active layers in corresponding ones of the thin film transistor groups on the light shielding layer.

4. The method according to claim 3,
    wherein a deviation between first quantities of heat per unit area of the plurality of sub-light shielding layers is not more than 3%, and
    wherein a first quantity of heat per unit area is a ratio of heat generated by one of the sub-light shielding layers to an area of the sub-light shielding layer.

5. The method according to claim 4, wherein forming the light shielding layer on the surface of the base substrate comprises:
    adjusting an area of each of the plurality of sub-light shielding layers based on a sheet resistance distribution of the light shielding layer, such that the deviation between the first quantities of heat per unit area of the plurality of sub-light shielding layers is not more than 3% when currents flow through the plurality of sub-light shielding layers are same as one another.

6. The method according to claim 5, wherein forming the light shielding layer on the surface of the base substrate further comprises:
    forming a conductive layer on a surface of the base substrate;
    detecting sheet resistance values $R_1, R_2, \ldots, R_n$ at n positions on the conductive layer, and calculating an average sheet resistance value $R_{average}$ of the conductive layer based on detected sheet resistance values; and
    patterning the conductive layer to form M sub-shielding layers, wherein an area of an i-th sub-light shielding layer is determined based on formula $A_i'=(R_{average}/R_i) \times A_i$,
    wherein $A_i'$ is an actual area of the i-th sub-light shielding layer, $A_i$ is a theoretical area of the i-th sub-light shielding layer, and $R_i$ is a sheet resistance value corresponding to the i-th sub-light shielding layer, and
    wherein n is a positive integer, M is a positive integer greater than 1, and i is a positive integer between 1 and M.

7. The method according to claim 4, wherein energizing the light shielding layer comprises:
    adjusting a current flowing through each of the plurality of sub-light shielding layers based on a sheet resistance distribution of the light shielding layer, such that the deviation between the first quantities of heat per unit area of the plurality of sub-light shielding layers is not more than 3%.

8. The method according to claim 2,
    wherein the plurality of thin film transistors share a light shielding layer, and the light shielding layer is divided into a plurality of predetermined regions based on a sheet resistance distribution of the light shielding layer,
    wherein energizing the light shielding layer comprises connecting a third contact and a fourth contact on the light shielding layer to a positive pole and a negative pole of a power source respectively, and
    wherein the third contact and the fourth contact are on both sides of an orthographic projection of active layers in the thin film transistors on the light shielding layer.

9. The method according to claim 8,
    wherein a deviation between second quantities of heat per unit area of the plurality of predetermined regions is not more than 3%, and
    wherein a second quantity of heat per unit area is a ratio of heat generated by one of the predetermined regions to an area of the predetermined region.

10. The method according to claim 9, wherein forming the light shielding layer on the surface of the base substrate comprises:
    adjusting an area of each of the predetermined regions according to a sheet resistance distribution of the light shielding layer, such that the deviation between the second quantities of heat per unit area of the plurality of predetermined regions is not more than 3% when currents flow through the plurality of predetermined regions are same as one another.

11. The method according to claim 10, wherein forming the light shielding layer on the surface of the base substrate further comprises:
- forming a conductive layer on a surface of the base substrate;
- detecting sheet resistance values $R_1, R_2, \ldots, R_n$ at n positions on the conductive layer, and calculating an average sheet resistance value $R_{average}$ of the conductive layer based on detected sheet resistance values; and
- patterning the conductive layer to form N predetermined regions,
- wherein an area of an i-th predetermined region being determined based on formula $S_i'=(R_{average}/R_i) \times S_i$,
- wherein $S_i'$ is an actual area of the i-th predetermined region, $S_i$ is a theoretical area of the i-th predetermined region, and $R_i$ is a sheet resistance value corresponding to the i-th predetermined region, and
- wherein n is a positive integer, N is a positive integer greater than 1, and i is a positive integer between 1 and N.

12. The method according to claim 9, wherein energizing the light shielding layer comprises:
- adjusting a current flowing through each of the predetermined regions based on a sheet resistance distribution of the light shielding layer, such that the deviation between the second quantities of heat per unit area of the plurality of predetermined regions is not more than 3%.

13. The method according to claim 2, wherein energizing the light shielding layer comprises electrically connecting the light shielding layer to a power source through a wire, and wherein the method further comprising:
- forming a transition layer at a contact where the light shielding layer makes contact with the wire, the transition layer encapsulating the contact and a portion of the wire.

14. The method according to claim 1, further comprising:
- forming a first buffer layer between the base substrate and the light shielding layer.

15. A display substrate fabricated by the method according to claim 1.

16. A display device comprising the display substrate according to claim 15.

* * * * *